United States Patent [19]

Aoki et al.

[11] Patent Number: 4,838,993
[45] Date of Patent: Jun. 13, 1989

[54] METHOD OF FABRICATING MOS FIELD EFFECT TRANSISTOR

[75] Inventors: Kenji Aoki; Masafumi Shimbo, both of Tokyo, Japan

[73] Assignee: Seiko Instruments Inc., Tokyo, Japan

[21] Appl. No.: 128,088

[22] Filed: Dec. 3, 1987

[30] Foreign Application Priority Data

Dec. 4, 1986 [JP] Japan .................. 61-289162

[51] Int. Cl.⁴ .................. H01L 21/306; B44C 1/22; C03C 15/00; C03C 25/06
[52] U.S. Cl. .................. 156/643; 148/DIG. 50; 156/649; 156/653; 156/657; 156/659.1; 156/662; 437/78; 437/105; 437/112; 437/228; 437/34; 437/913
[58] Field of Search ............... 156/643, 646, 648, 649, 156/650, 653, 657, 659.1, 662; 357/23.5, 41, 42, 44, 56; 437/34, 38, 41, 57, 58, 59, 78, 191, 228, 239, 913, 105, 108, 112; 148/DIG. 50

[56] References Cited

U.S. PATENT DOCUMENTS 4,636,269 1/1987 Boland .................. 156/649 X

Primary Examiner—William A. Powell
Attorney, Agent, or Firm—Bruce L. Adams; Van C. Wilks

[57] ABSTRACT

A novel MOS field effect transistor which operates at high speed and with low power consumption has impurity doped source and drain regions deposited at 850° C. or less by molecular layer epitaxial growth method. The molecular layer epitaxial growth is concurrently carried out with the control of impurity doping concentration so that the layers epitaxially deposited has a lightly doped region and a heavily doped region. Since the thickness of the growth layer can be controlled with a degree of accuracy on the order of an atom layer and thermal diffusions can remarkably be reduced by the low deposition temperature, an overlap of a gate over each of the source and drain regions can be reduced to 500 Å or less.

4 Claims, 3 Drawing Sheets

METHOD OF FABRICATING MOS FIELD EFFECT TRANSISTOR

BACKGROUND OF THE INVENTION

1. Field of the Invention

This invention relates to a MOS field effect transistor which operates at high speed and with low power consumption. The layers for a source region and a drain region are deposited by molecular layer epitaxial growth at temperatures of 850 degree centigrade (°C.) or less by which the thickness of the layer can be controlled with a degree of accuracy on the order of a single atom layer. In addition, a lightly doped region and a heavily doped region are provided at least in the drain region, which forms a lightly doped drain (LDD) structure, during the molecular layer epitaxial growth. The combination of the molecular layer epitaxial growth and the LDD structure according to the invention enables to reduce an overlap of the gate over each of the source region and drain region to 500Å or less resulting in higher operation speed and low power consumption.

2. Prior art

Miniaturization technique is indispensable for improving the efficiency and performance of semiconductor devices. However, one of the problems in miniaturizing an insulated gate field effect transistor (MOS FET) with an extremely short channel length is the short channel effect in which threshold voltage is lowered. This is caused by the shortened effective channel length as a result of spreading of depletion region toward the gate from a drain region. In order to prevent the short channel effect, the following measures are provided : (i) to increase impurity concentration in channel region; and (ii) to decrease the thickness of the source/drain diffusion layers and to decrease their horizontal extension of diffusion toward the gate. In the light of the above, a MOS EFT having LDD structure has conventionally been provided according to the process shown in FIG. 2(a)-(e). After the surface oxidization of, for example, p-type substrate 7, a polysilicon layer is deposited and a gate 9 is formed by using a photo resist 10, as shown in FIG. 2 (a) and (b). In FIG. 2(c), n- ion implantation and thereafter annealing (generally at 1000°-1200° C.) are carried out to form lightly doped regions 11 and 12. At this stage thermal diffusion occurs towards the region under the gate. FIG. 2 (d) shows a step in which after the photo resist 10 is removed, a mask film 15 for ion implantation is deposited by chemical vapor deposition (CVD), and n+ ion implantation is carried out to form n+regions 13 and 14. The mask film 15 damaged by the ion implantation is removed and then an oxide film 16 is deposited as shown in FIG. 2(e).

However, the conventional measure as described hereabove are not fully satisfactory. Since the impurity implantation is carried out by ion implantation and then annealing is carried out generally at 1000°-1200° C., three dimensional diffusion defined by the ion acceleration energy and annealing temperature can not be avoided, and consequently there are limitations in terms of the control of diffusion depth. It was therefore extremely difficult or almost impossible to control diffusion depth with a degree of accuracy on the order of 1000 Å or less.

SUMMARY OF THE INVENTION

An object of the invention therefore is to solve the problems associated with the abovementioned conventional measures. Another object of the invention is to provide a novel MOS FET with a source and a drain regions having a lightly doped region and a heavily doped region therein which are deposited through the use of an epitaxial growth method. Still another object of the invention is to provide a method of fabrication of the novel MOS EFT according to the invention.

PREFERRED EMBODIMENT OF THE INVENTION

Figure 1A:
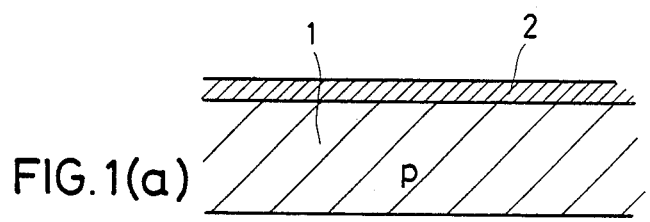
FIG. 1 (a)-(d) sectionally illustrate, in the process order, the manufacturing process of MOS FET having an LDD structure which is fabricated according to the invention.
Figure 1B:
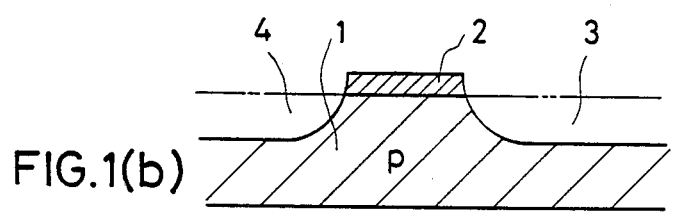
Figure 1C:
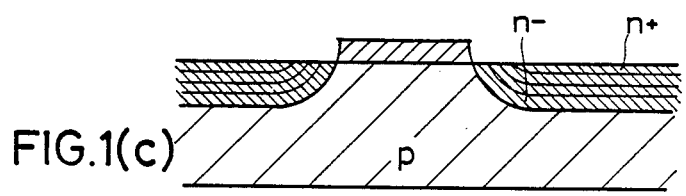
Figure 1D:
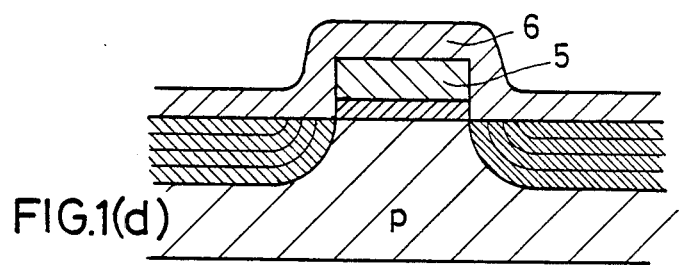
Figure 2A:
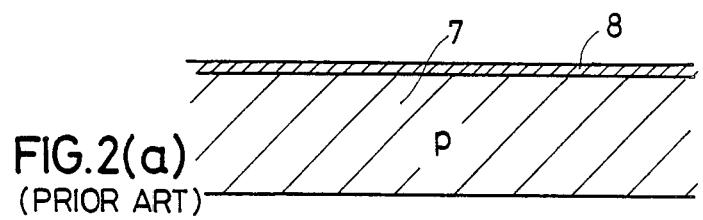
FIG. 2 (a)-(e) sectionally illustrate, in the process order, the MOS FET having an LDD structure fabricated according to the conventional manufacturing method.
Figure 2B:
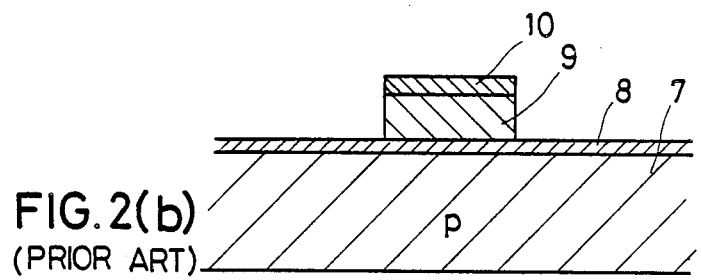
Figure 2C:
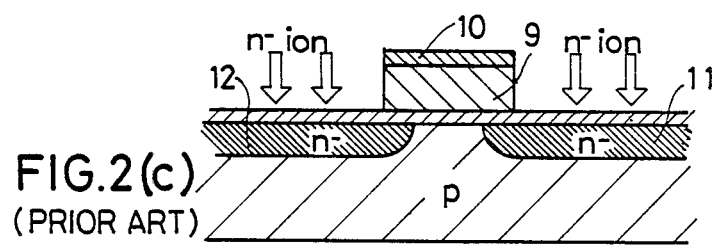
Figure 2D:
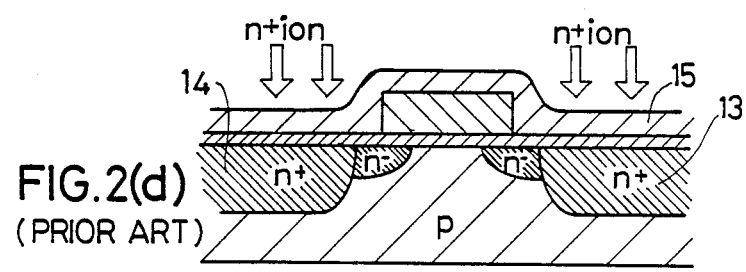
Figure 2E:
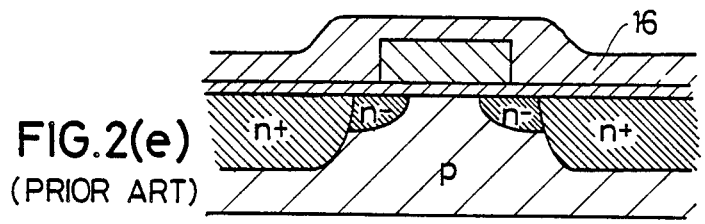
Figure 3:
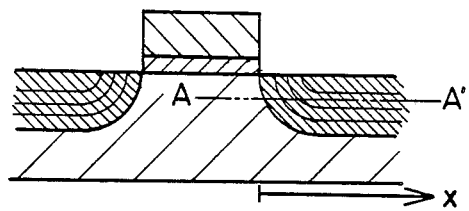
FIG. 3 illustrates a cross-section representing the source and drain regions and gate fabricated according to the present invention.
Figure 4:
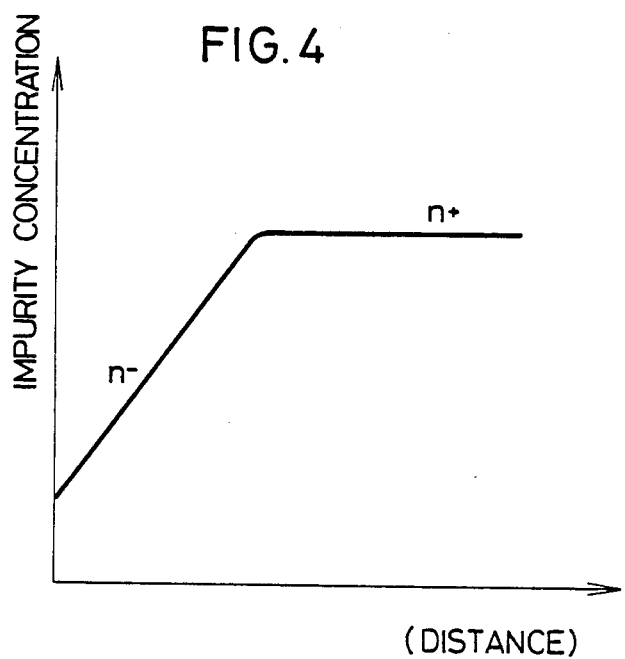
FIG. 4 shows an example of the impurity distribution in the direction of X taken on the line A—A' in FIG. 3.

The invention is hereunder described in detail with reference to a preferred embodiment in which a p-type substrate is used. Referring to FIG. 1 (a), the surface of a p-type substrate 1 is thermally oxidized to form an oxidized film 2. After patterning, the surface of the substrate is etched by anisotropic etching such as Reactive Ion Etching to form a source forming region 4 and a drain forming region 3, while leaving a gate insulated film 2, as shown in FIG. 1 (b). FIG. 1 (c) shows a step in which layers are selectively grown at 850° C. or less by applying molecular layer epitaxial growth method while impurity doping concentration of the layers is adjusted by controlling the supply of the impurity source gas so that the impurity concentration has such distribution as shown in FIG. 4 in the direction of x along the line A—A' in FIG. 3. Molecular epitaxial growth method by which a single crystal can be grown at temperatures of 850° C. or less in units of an atom layer is used here to form a source region and a drain region. Since the growth temperature is 850° C. or less, auto-doping and thermal diffusion are remarkably small. Further, a lightly doped region and a heavily doped region are provided during the foregoing epitaxial growth in order to reduce the short channel effect which is a phenomenon presented in a very small device having an extremely short channel length. On completing the deposition of the layers of the source and drain regions, a layer of polysilicon or other high melting point materials such as Mo silicide, W silicide, etc. is deposited, patterning is carried out, and then a gate 5 is formed by etching. Finally, an oxide film 6 is deposited, as shown in FIG. 1 (d). The longitudinal diffusion depth of the source and drain regions and the horizontal diffusion depth towards the region under the gate are defined by thermal diffusion temperature of the substrate. In the invention, since the impurity layers are deposited at 850° C. or less by molecular layer epitaxial growth, thermal diffusion is negligibly small compared with the conventional ion implantation method accompanied with annealing.

EFFECT OF THE INVENTION

As described hereinabove, according to the present invention, the impurity doped layer having a lightly doped region and a heavily doped region is formed concurrently with the epitaxial growth of the layer. As the thickness of the growth layer epitaxially grown can be controlled with a degree of accuracy on the order of an atom layer, it is possible to fabricate a MOS EFT with an impurity doped layers having an impurity concentration distribution which cannot be formed by the conventional method utilizing ion implantation. Further, the extent of the source and drain region into the region under the gate is 500 Å or less, and therefore the overlap of the gate and the source and drain regions is extremely small compared with that in the case of the prior art. This feature is highly effective and important in terms of the miniaturization of the devices. The MOS FET having such features as described hereinabove is also excellent in preventing fluctuation of the device characteristics due to generation of hot carriers which results from miniaturaization.

We claim:

1. A process for fabricating a MOS field effect transistor comprising: a first step for thermally oxidizing a surface of a substrate of first semiconductor to form an oxide film, a second step for, after patterning, etching away said surface to form a gate insulated film, a source forming region and a drain forming region in said substrate, a third step for epitaxially depositing layers of second semiconductor in said source forming region and said drain forming region by applying an epitaxial growth method to form a source and a drain regions of second semiconductor having a lightly doped region and a heavily doped region therein, a fourth step for depositing a layer of polysilicon or other high melting point materials on said oxide film and said source and drain regions, and a fifth step for, after patterning, etching away said layer to form a gate on said gate insulated film.

2. A process for fabricating a MOS field effect transistor according to claim 1; wherein said epitaxial growth method comprises a molecular beam epitaxial growth method carried out at temperatures of 850° C. or less.

3. A process for fabricating a MOS field effect transistor according to claim 1; wherein said lightly doped region and heavily doped region are provided by controlling the concentration of impurity concurrently with said epitaxial growth being carried out.

4. A process for fabricating a MOS field effect transistor according to claim 1; wherein said etching to form said source forming region and said drain forming region comprises an anisotropic etching such as a reactive ion etching.

* * * * *